United States Patent [19]

Kimura

[11] Patent Number: 5,214,683
[45] Date of Patent: May 25, 1993

[54] CHARGE DETECTING DEVICE CONTROLLING RESET TRANSISTOR OPERATION

[75] Inventor: Tetsuji Kimura, Tokyo, Japan

[73] Assignee: NEC Corporation, Tokyo, Japan

[21] Appl. No.: 894,486

[22] Filed: Jun. 8, 1992

[30] Foreign Application Priority Data

Jun. 7, 1991 [JP] Japan .................................. 3-136414

[51] Int. Cl.⁵ ........................ G11C 19/28; H01L 29/78
[52] U.S. Cl. ...................................... 377/60; 257/239; 257/216
[58] Field of Search ...................... 357/24; 377/57–63; 257/239, 216–224

[56] References Cited

U.S. PATENT DOCUMENTS 4,809,307  2/1989  Sakaue et al. .......................... 377/60

*Primary Examiner*—Gene M. Munson
*Attorney, Agent, or Firm*—Sughrue, Mion, Zinn, Macpeak & Seas

[57] ABSTRACT

A charge detecting device comprises a floating diode for accumulating a signal charge, a source-follower amplifier for detecting a variation in a surface potential of the floating diode, a reset transistor, a transistor having a same size to the reset transistor for detecting a channel potential of the reset transistor and a reset pulse supplying means including an inverting amplifier, in which the channel potential of the reset transistor detected by the transistor is amplified and is added with a binary digit pulse inputted through an AC coupled capacitor to be made into a reset pulse which is applied to a gate electrode of the reset transistor. This allows automatic setting of each level of the suitable reset pulse in response to a variation in the channel potential of the reset transistor without any external circuits for setting reset pulse levels.

8 Claims, 5 Drawing Sheets $$R_H = \frac{V_{RD} \; \Psi_0}{k}$$

CHARGE DETECTING DEVICE CONTROLLING RESET TRANSISTOR OPERATION

BACKGROUND OF THE INVENTION

This invention relates to a charge detecting device, and more particularly, to a charge detecting device in a charge coupled device in which an operating condition of a reset transistor is automatically controlled.

A structure and an operation of a typical charge detecting device in a prior art which may be applied to a solid state imaging device using a charge coupled device (CCD) will hereinafter fully be described in detail with reference to the accompanying drawings.

Referring to FIG. 1, a typical charge detecting device of a floating diode amplifier type comprises an n-type semiconductor substrate 105, an input gate electrode 101, a floating diode composed of an n+-region 102, a source-follower amplifier 108 and a reset transistor 120 composed of n+-regions 110 and 111 and a gate electrode 109. The input gate electrode 101 is held at a constant voltage $V_{OG}$ and serves to input a signal charge fed from a charge transfer section in the solid-state imaging device into the charge detecting means. The floating diode serves to accumulate the signal charge inputted through the input gate electrode 101. The source-follower amplifier 108 serves to detect a variation of a surface potential of the floating diode caused by the signal charge accumulated in the n+-region 102 of the floating diode. The reset transistor 120 comprises a source also serving as n+-region 102 of the floating diode, a gate electrode 107, a drain 106 and a channel region and serves to drain unnecessary signal charge accumulated in the source after a charge detecting operation.

In the operation of the charge detecting device, when the reset transistor 120 turns on, the unnecessary signal charge is drained from the n+-region 102, whereby a surface potential V of the n+-region 102 is maintained at a constant reset potential. Subsequently, the reset transistor 120 turns off and a signal charge Q transferred from the solid-state imaging device is inputted into a potential well of the n+-region 102 through the input gate electrode 101. This causes a variation in the surface potential of the n+-region 102. The variation is outputted as an output voltage $V_{out}$ through the source-follower amplifier 108. The output voltage $V_{out}$ is given by $$V_{out} = (Q/C_{FJ})(g_m R_S)/(1 + g_m R_S) \quad (1)$$

where $g_m$ is the transconductance of the transistor of the source-follower amplifier 108, $R_S$ is the source resistance and $C_{FJ}$ is the capacitance of the n+-region 102. It is therefore understood that the output voltage $V_{out}$ is proportional to the signal charge Q.

Further, an operation of the reset transistor 120 will hereinafter fully be described in more detail.

Referring to FIG. 5, the reset transistor 120 as a part of the CCD solid-state imaging device normally comprises a buried channel type transistor in which a channel potential $\phi_{ch}$ varies in proportion to a gate voltage $V_G$ in a wide linear region. The channel potential $\phi_{ch}$ is therefore given by $$\phi_{ch} = k \cdot V_G + \phi_0 \quad (2)$$

where k is the proportional coefficient, $\phi_0$ is the channel potential when the gate voltage $V_G$ is 0.

The reset transistor 120 turns on and the surface potential of the floating diode is maintained at the constant reset potential by draining completely the unnecessary signal charge accumulated in the floating diode. Required for the realization of this operation is that a high level $R_H$ of reset pulse to be applied to the gate electrode of the reset transistor 120 (as hereinafter referred to as a reset pulse $\phi_R$) is set so that the channel potential $\phi_H$ is higher than a constant drain voltage $V_{RD}$ of the reset transistor 120 at the pulse applying time ($\phi_H = V_{RD} + \alpha$) and so that the transfer channel region under the gate electrode of the reset transfer 120 is ordinary satisfied with sufficient electrons during the draining operation. When the channel potential $\phi_H$ is equal to or lower than the drain voltage $V_{RD}$ of the reset transistor 120, the drain of the signal charge accumulated in the n+-region of the floating diode is ultimately regulated by the diffusion of the signal charge. The normal reset operation in which the frequency of the reset pulse to be applied to the gate electrode 107 of the reset transistor 120 is in the range of the frequency from several MHz to tens MHz is impossible for the realization of the complete drain of the unnecessary signal charge. Assuming that the signal charge detecting device is applied to the normal electronic device, the charge detecting device may be applied with a driving voltage common to other ICs. The reset pulse $\phi_R$ of the charge detecting device is therefore set at the amplitude of 5 V and a constant DC voltage, where the high level of the pulse is $R_H$ and the low level of the pulse is $R_L$.

When the channel potential $\phi_H$ is higher than the constant drain voltage $V_{RD}$ of the reset transistor 120, the channel potential $\phi_L$ corresponding to the low level $R_L$ of the reset pulse $\phi_R$ is taken into a high potential. In this case, since the potential of the floating diode is set at the constant potential $V_{RD}$, maximum quantity of the signal charge of the charge detecting device is proportional to the value $(V_{RD} - \phi_L)$. When the channel potential $\phi_H$ is set too high, as compared with the constant potential $V_{RD}$ of the floating diode, the maximum quantity of the signal charge is substantially decreased in proportion to the decrease of the value $(V_{RD} - \phi_L)$. It is therefore required that the channel potential $\phi_H$ is set at a higher potential than the floating diode potential equal to the drain voltage $V_{RD}$ and the, maximum quantity of the signal charge of the charge detecting device is equal to or higher than the maximum quantity of the signal charge to be inputted into the floating diode. From the equation (2), the low level of the reset pulse $\phi_R$ to be applied to the gate electrode of the reset transistor 120 is given by $$R_H = (V_{RD} + \alpha - \phi_0)/k, \quad 0 < \alpha < \phi_M \quad (3)$$

where $\phi_M$ is the maximum channel potential on the above conditions, $V_{RD}$ is the drain voltage of the reset transistor 120, $\phi_0$ is the channel potential when the gate voltage $V_G$ is 0, and k is the proportional coefficient.

Thus, the following problems are associated with the prior art set forth above.

An individual charge detecting device requires an external circuit for setting each of a high level $R_H$ and a low level $R_L$ of the reset pulse in response to the channel potential of the reset transistor 120 in order to fulfill a complete reset operation. Further, what is required for only one charge detecting device is also an external circuit for setting each of a high level $R_H$ and a low level $R_L$ of the reset pulse in response to the variable channel potential of the reset transistor 120 in order to fulfill a complete reset operation.

SUMMARY OF THE INVENTION

An object of the present invention is to provide a charge detecting device eliminating an external circuit which sets each level of a reset pulse to be applied to a reset transistor.

A novel charge detecting device of the present invention comprises a floating diode formed on a semiconductor substrate for accumulating signal charges delivered from an external signal charge input device, a source-follower amplifier including one or more stages and being connected to the floating diode, for detecting and outputting a variation in the surface potential of the floating diode caused by inputting signal charge, a reset transistor receiving a reset pulse for draining unnecessary signal charge to the external portion of the device before commencement of the detecting operation of the surface potential variation of the floating diode, a channel potential detecting transistor formed on the semiconductor substrate so as to have the same channel potential as the reset transistor, for detecting the channel potential of the reset transistor, means for controlling the reset pulse in accordance with the channel potential, which is connected to the channel potential detecting transistor.

The channel potential of the reset transistor is detected by the channel potential detecting transistor and is converted into a DC basis voltage level by the inversion amplifier. The DC basis voltage is added with the reset pulse to control its pulse height so as to perform the complete charge drain from the floating diode by the reset transistor.

This allows to set automatically a precise reset pulse in order to fulfill a complete charge-drain operation without an external circuit for a pulse setting.

BRIEF DESCRIPTION OF THE DRAWINGS

Preferred embodiments of the present invention will hereinafter fully be described in detail with reference to the accompanying drawings in which.

PREFERRED EMBODIMENTS OF THE INVENTION

A structure of a novel charge detecting device according to the present invention will hereinafter fully be described with reference to the accompanying drawings.

Figure 1:
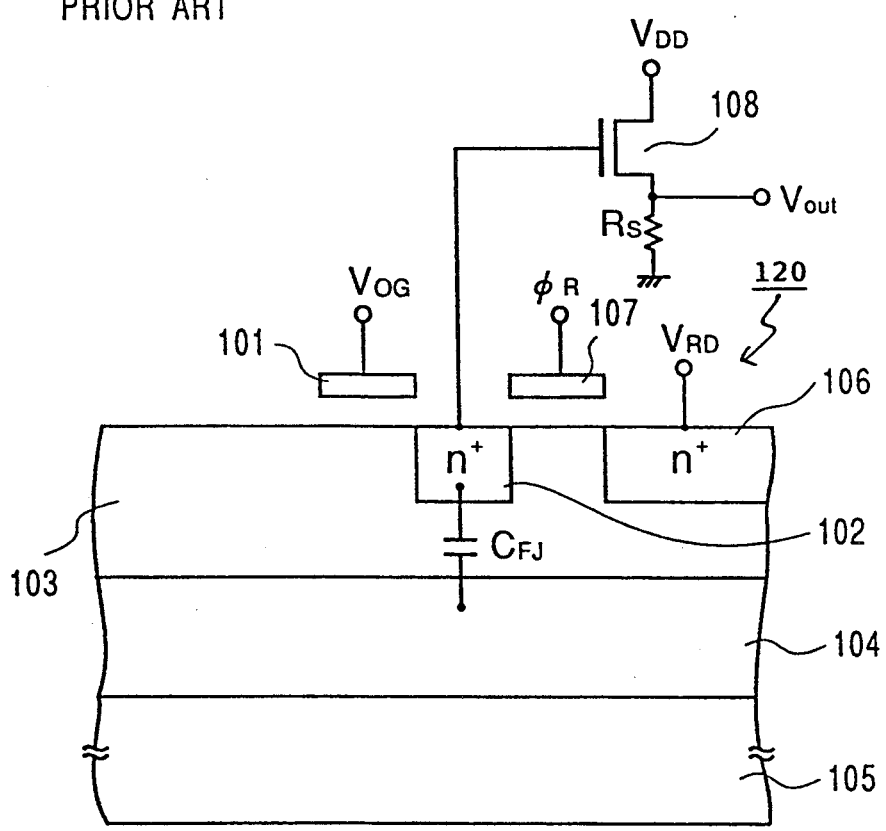
FIG. 1 is a circuit diagram illustrative of the conventional charge detecting device.
Figure 2:
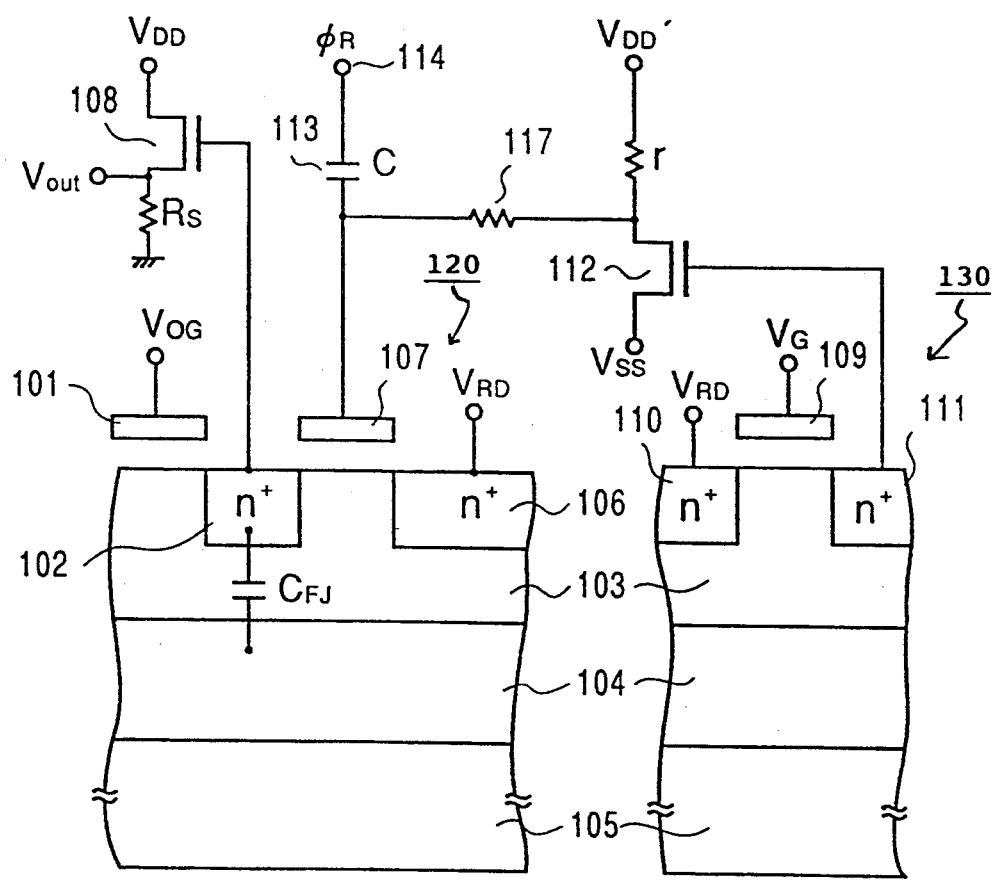
FIG. 2 is a circuit diagram illustrative of one embodiment of a charge detecting device according to the present invention.

Referring to FIG. 2, the novel charge detecting device comprises not only a n-type semiconductor substrate 105, a p-type well region 104 formed on the semiconductor substrate 105, an n-type well region 103 formed on the p-type well region 104, an input gate electrode 101, a floating diode of an n+-region 102 formed in the n-type well region 103, a source-follower amplifier 108 and a rest transistor 120 having a source region of the n+-region and a drain region 106 formed in the n-type well region 103, but also a channel potential detecting transistor 130 formed in the same n-type well region 103, an inverting amplifier 112 and a differentiation circuit of a resistor 117 and a capacitor 113. Namely, as compared with the prior art, the novel charge detecting device is further provided with the channel potential detecting transistor 130, the invertor amplifier and the differentiation circuit so as to fulfill an automatic setting of each pulse height of a reset pulse to be applied to the gate electrode of the reset transistor 130 without any external circuits.

The input gate electrode 101 serves to input a signal charge delivered through a CCD charge transfer section into the floating diode. The floating diode comprises a n+-type region 102, n-type well region 103 and p-type well region 104 and serves to accumulate the signal charge inputted through the input gate electrode 101 so as to cause a variation in surface potential of the n+-region 102. The source-follower amplifier 108 is connected to the n+-region 102 as the floating diode and serves to detect the variation in surface potential of the floating diode so as to carry out detection of the signal charge. The reset transistor 120 comprises a source also serving as n+-type region 102 of the floating diode, a gate electrode 107 to be applied with the reset pulse for controlling a reset operation, a drain of an n+-region 106 to be applied with a constant voltage $V_{RD}$ and a channel region under the gate electrode. The reset transistor 120 also serves to drain unnecessary signal charge accumulated in the source region or the n+-type region 102 of the floating diode before a charge detecting operation. The channel potential detecting transistor comprises a drain of n+-region 110 to be applied with a constant voltage equal to the constant drain voltage of the reset transistor, a gate electrode 109, a source of n+-region 111 and a channel region. Further the channel potential detecting transistor 130 is so designed that a channel potential thereof is equal to the channel potential of the reset transistor 120 by being formed in the same n-type well region. Both the reset transistor 120 and the channel potential detecting transistor 130 may be designed in the same size or identical channel length and channel width. The channel potential detecting transistor 130 may therefore serve to detect and output the channel potential of the reset transistor 120.

The inverting amplifier 112 is connected to the channel potential detecting transistor 130 and serves to amplify the channel potential supplied from the channel potential detecting transistor 130. The differentiation circuit comprises an AC coupling capacitor 113 and a resistor 117 whose resistance value is too high, as compared with an output impedance of the invertor amplifier, for example, 50 kΩ at the 100 Ω output impedance.

The differentiation circuit has a suitable damping time constant in order to secure a waveform without dullness of the reset pulse in the range of the frequency of the reset pulse, for example, from several MHz to tens MHz.

A reset operation of the set forth novel charge detecting device of one embodiment of the invention will hereinafter fully be described in detail.

Signal charges are delivered from, for example, an imaging section formed in the same semiconductor substrate 105 and through a CCD charge transfer section in the same substrate 105, and are inputted into the n+-type region 102 of the floating diode through the input gate electrode 101. Since at this time the reset transistor turns on, the signal charges are accumulated in the floating diode so as to cause a variation in the surface potential of the n+-region 102. The variation in the surface potential of the n+-region 102 is detected by the source-follower amplifier 108 whose gate electrode is connected to the n+-region 102 of the floating diode.

Before the charge detecting operation, the signal charge accumulated in the n+-type region 102 of the floating diode is required to be completely drained in order to secure a precision of the following charge detecting operation.

The gate electrode 109 of the channel potential detecting transistor 130 is applied with a suitable voltage $V_S$. The source 111 of the channel potential detecting transistor 130 is taken into a channel potential in proportion to the gate voltage $V_S$. Then, the potential $\phi_S$ of the source of the channel potential detecting transistor 130 is given by $$\phi_S = k \cdot V_S + \phi_0 \qquad (4)$$

where k is the proportional coefficient, and $\phi_0$ is the channel potential when the gate voltage $V_G$ is 0. Then, the reset transistor turns off to deliver the unnecessary signal charge from the source also serving as the n+-type region of the floating diode. The complete draining operation of the signal charge depends on the each level of the reset pulse to be applied to the gate electrode 107 of the reset transistor 120.

Consequently, the potential $\phi_S$ is converted into a potential $V_0$ through the inverting amplifier 112. The output level $V_0$ of the inverting amplifier 112 is added with a binary digit pulse which is delivered from an input terminal 114 through the AC coupling capacitor 113, so as to be made into a reset pulse. The reset pulse is applied to the gate electrode 107 of the reset transistor 120. Assuming that a high level of the reset pulse $\phi_R$ is 5 V, a low level of the reset pulse $\phi_R$ is 0 V and the duty ratio is a %, high, with the average voltage of the reset pulse per cycle being given by 5×(a/100), the high level $R_H$ and the low level $R_L$ of the reset pulse $\phi_R$ are given by $$R_H = V_0 + 5 - 5 \times (a/100) \qquad (5)$$

$$R_L = V_0 - 5 \times (a/100) \qquad (6)$$

From the equations (3) and (5), the voltage $V_O$ is given by $$V_0 = (V_{RD} + \alpha + \phi_0)/k + 5 \times (a/100) - 5 \qquad (7)$$

Therefore, output voltage of the invertor amplifier $V_0$ is set on the basis of the equation (7).

Figure 4:
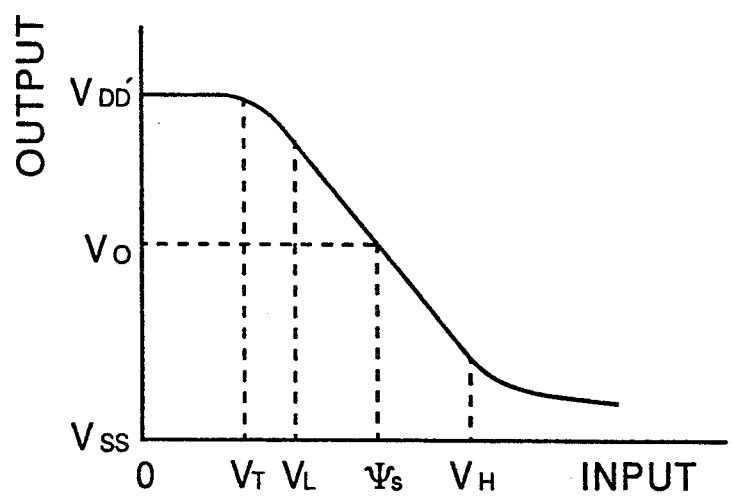
FIG. 4 is a schematic diagram illustrative of the input characteristic of the inverting amplifier.
Figure 5:
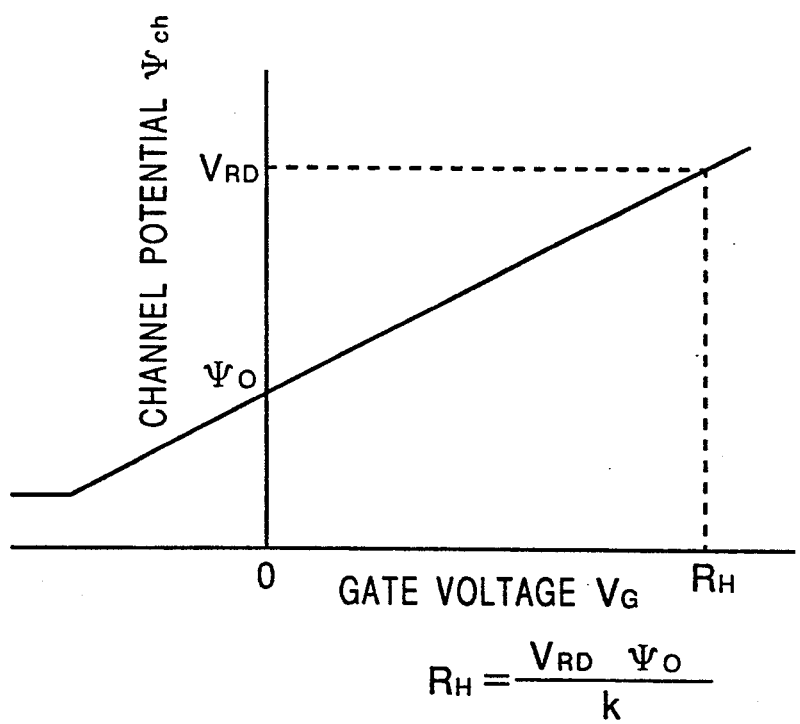
FIG. 5 is a schematic diagram illustrative of the characteristic of channel potential to gate voltage of the buried channel type transistor.

Referring to FIG. 4, understood is an input-output characteristic of a typical inverting amplifier where $V_H$ is the maximum input voltage in the linear region, $V_L$ is the minimum input voltage in the linear region, $V_T$ is the threshold voltage of a MOS transistor for the inverting amplifier.

This inverting amplifier is so designed that the input voltage $\phi_S$ and output voltage $V_0$ are in the approximately center portion of the linear region and the voltage gain −G of the amplifier is inversely proportional to −k, where k is the proportional coefficient of the channel potential to the gate voltage of the reset transistor 120. This allows to supply automatically the precise reset pulse $\phi_R$. Normally, a variation in the channel potential of the rest transistor 120 independents on the gate voltage of the rest transistor 120 and is approximately constant, for example, the variation $\pm\Delta\phi$ is 1.0 V. Since the channel potential detecting transistor 130 is so designated that the channel potential thereof is equal to the channel potential of the reset transistor 120, the channel potential of the channel potential detecting transistor 130 varies. When the gate electrode 109 of the channel potential detecting transistor 130 is applied with the voltage $V_S$, the source potential is equal to the channel potential. Then, the source of the channel potential detecting transistor 130 is taken into a potential $\phi_S \pm \Delta\phi$. In the invertor amplifier, voltage gain is $-1/k$, output is made into $V_0 \pm \Delta\phi/k$. The high level $R_H$ of the rest pulse $\phi_R$ is made into $R_H \pm \Delta\phi/k$. While, the variation $\pm\Delta\phi$ of the channel potential of the reset transistor 120 causes a variation.

Figure 3:
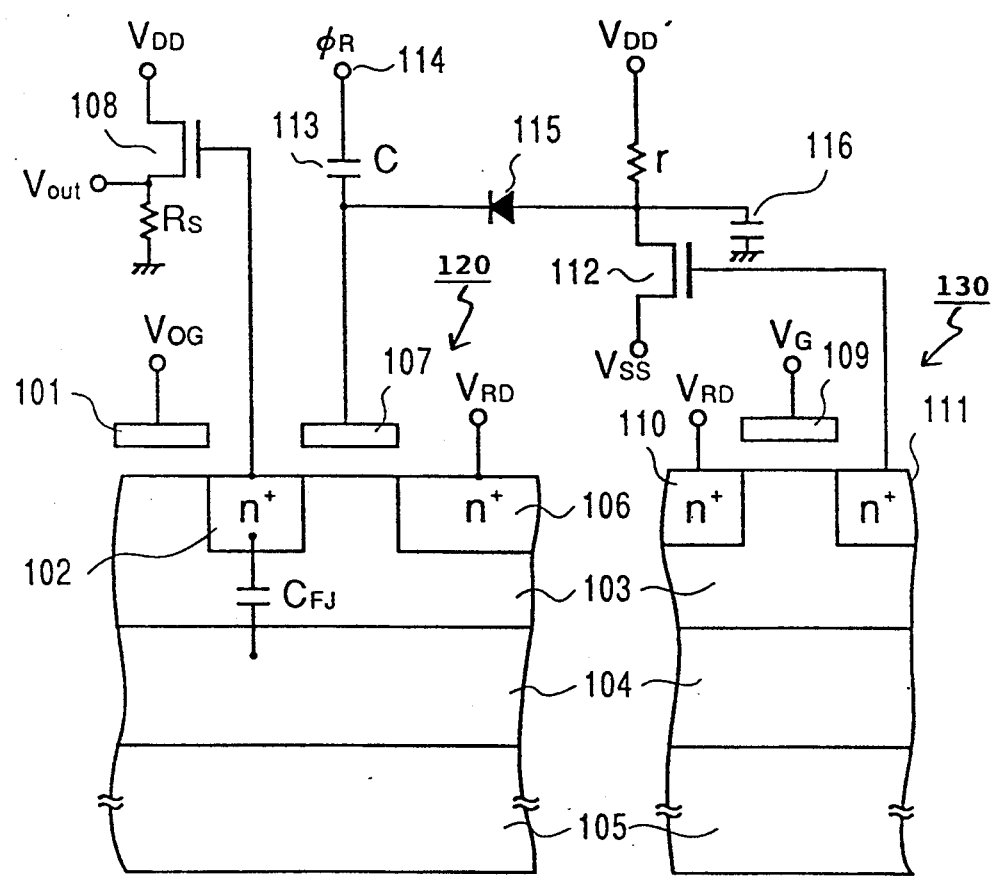
FIG. 3 is a circuit diagram illustrative of an alternate embodiment of a charge detecting device according to invention.

Referring to FIG. 3, the charge detecting device may be modified by replacing the resistor of the differentiation circuit with a diode 115. In this case, each of the high level $R_H$ or the low level $R_L$ of the reset pulse $\phi_R$ is independent of the duty ratio. For example, at the high level and the low level of the binary digit pulse are 5 V and 0 V respectively, the duty ratio is a %, fall of potential of the diode is $V_F$, and the high level and the low level of the reset pulse are respectively given by $$R_H = V_0 + 5 - V_F \qquad (8)$$

$$R_L = V_0 - V_F \qquad (9)$$

Nevertheless the set forth reset transistor 120 and the channel potential detecting transistor 130 are n-channel type transistors. A p-type channel transistor may be available for both the reset transistor 120 and the channel potential detecting transistor 130, but both transistors are same conductive type transistors and are depletion type transistors.

The charge detecting device according to the present invention allows automatic setting of each level of the reset pulse to be applied {o the reset transistor without any external circuits for level setting of the reset pulse. Although there is a variation of the channel potential of the reset transistor 120, a complete reset operation without a decrease of the maximum quantity of the signal charge may always be carried out only with applying the constant binary digit pulse, for example, 5 V and 0 V.

Whereas alterations and modifications of the present invention will no doubt be apparent to a person of ordinary skilled in the art, it is to be understood that the embodiments shown and described by way of illustration are by no means intended to be considered limitation. Accordingly, it is to be intended by the claims to cover all alterations and modifications of the invention which fall in the spirit and scope of the invention.

What is claimed is:

1. A charge detecting device comprising:
   a floating diode formed on a semiconductor substrate for accumulating signal charges delivered,
   a source-follower amplifier connected to said floating diode for detecting a variation in a surface potential of said floating diode,
   A reset transistor formed on said semiconductor substrate, for draining signal charges accumulated in said floating diode before a charge detecting operation, said reset transistor using a region of said floating diode as one of source and drain regions, a channel potential detecting transistor formed on said semiconductor substrate for detecting a channel potential of said reset transistor, which has a channel potential equal to that of said reset transistor, and a reset pulse supplying means coupled to both said reset transistor and said channel potential detecting transistor for creating a reset pulse depending on said channel potential of said reset transistor and for applying said reset pulse to a gate electrode of said reset transistor.

2. A charge detecting device as claimed in claim 1, wherein said channel potential detecting transistor and said reset transistor are depletion type.

3. A charge detecting device as claimed in claim 2, wherein said channel potential detecting transistor has the same channel size as that of said reset transistor.

4. A charge detecting device as claimed in claim 3, wherein said channel potential detecting transistor and said reset transistor are n-channel type.

5. A charge detecting device as claimed in claim 3, wherein said channel potential detecting transistor and said reset transistor are p-channel type.

6. A charge detecting device as claimed in claim 1, wherein said reset pulse supplying means comprises an invertor amplifier connected to said channel potential detecting transistor, a circuit coupled to both said invertor amplifier and said reset transistor for supplying a reset pulse of a waveform without dullness to said reset transistor.

7. A charge detecting device as claimed in claim 6, wherein said circuit is a differentiation circuit comprising a capacitor and a resistor.

8. A charge detecting device as claimed in claim 6, wherein said circuit comprises a capacitor and a diode.

* * * * *